(12) United States Patent
Hioka

(10) Patent No.: US 6,803,764 B2
(45) Date of Patent: Oct. 12, 2004

(54) HIGH-SPEED SAMPLE SPINNER FOR SOLID NMR SPECTROSCOPY

(75) Inventor: Katsuya Hioka, Tokyo (JP)

(73) Assignee: Jeol Ltd., Tokyo (JP)

( * ) Notice: Subject to any disclaimer, the term of this patent is extended or adjusted under 35 U.S.C. 154(b) by 0 days.

(21) Appl. No.: 10/263,459

(22) Filed: Oct. 2, 2002

(65) Prior Publication Data

US 2003/0102867 A1 Jun. 5, 2003

(30) Foreign Application Priority Data

Sep. 12, 2002 (JP) ........................................ 2002-266255

(51) Int. Cl.$^7$ ................................................ G01V 3/00

(52) U.S. Cl. ........................................ 324/321; 324/318

(58) Field of Search ................................ 324/321, 318, 324/322, 309, 307, 308, 311; 415/202

(56) References Cited

U.S. PATENT DOCUMENTS

| 4,456,882 A | | 6/1984 | Doty ........................... 324/321 |
| 4,511,841 A | | 4/1985 | Bartuska et al. ............. 324/321 |
| 5,170,120 A | * | 12/1992 | Barbara et al. .............. 324/307 |
| 5,202,633 A | * | 4/1993 | Doty et al. .................. 324/321 |
| 5,333,994 A | * | 8/1994 | Doty et al. .................. 415/202 |
| 5,508,615 A | | 4/1996 | Doty et al. .................. 324/321 |

* cited by examiner

Primary Examiner—Brij B. Shrivastav
(74) Attorney, Agent, or Firm—Webb Ziesenheim Logsdon Orkin & Hanson, P.C.

(57) ABSTRACT

An improved high-speed spinner for solid-state NMR spectroscopy is provided. This spinner has a rotor portion comprising a radial flow type turbine that is rotated efficiently when a gas is blown at the turbine. Furthermore, stable high-speed rotation is assured. The gas blown at the turbine via gas supply holes formed in a turbine nozzle is vented rearward at a given angle to radial directions to thereby apply a rotating force to the turbine itself. The turbine has blades that are greater in number than the gas supply holes in the nozzle. The number of the blades is prime to the number of the gas supply holes.

12 Claims, 5 Drawing Sheets

α > 0

HIGH-SPEED SAMPLE SPINNER FOR SOLID NMR SPECTROSCOPY

BACKGROUND OF THE INVENTION

1. Field of the Invention

The present invention relates to a high-speed spinner for solid-state NMR measurements and, more particularly, to a high-speed spinner which is used for solid-state NMR measurements, provides a high rotational efficiency when a gas is blown at the spinner, and assures stable high-speed spinning.

2. Description of the Related Art

Interactions such as dipolar interactions are vanished in solutions by rotational Brownian motions. In NMR spectra of samples in solid state, such interactions manifest themselves directly. Therefore, the linewidths of the spectra are increased immensely. This conceals chemical shift terms. Consequently, in NMR spectra, signal peaks originating from various portions of a molecule under investigation cannot be separated. As a result, it has been considered that solid-state NMR spectroscopy is unsuited for analysis of molecular structures.

A method for overcoming this undesirable phenomenon and obtaining sharp solid-state NMR spectra was discovered by E. R. Andrew in 1958. In particular, a sample tube is tilted at a given angle to the direction of a static magnetic field and spun at a high speed. This removes anisotropic interactions and thus chemical shift terms can be extracted. This principle is known as MAS (magic-angle sample spinning).

To implement the magic-angle sample spinning, a solid sample placed in a static magnetic field must be spun at a high speed. However, it is not easy to obtain the required rotational speed of several kilohertz to tens of kHz. In the past, gas bearing technology has been adopted, and various methods have been proposed to obtain such rotational speeds.

FIG. 6 shows a conventional high-speed spinner for solid-state NMR spectroscopy. This spinner has a cylindrical stator 11 surrounding the outer surface of a rotor 12 with a slight space between them. The rotor 12 is sealed with a solid sample. A thrust rotor 14 is mounted at the lower end of the rotor 12 and placed opposite to a thrust stator 13 acting to cover the bottom of the cylindrical stator 11. The thrust rotor 14 acts to hold the position of the rotor 12 in the thrust direction. A turbine 16 is mounted at the top of the rotor 12 to apply a rotating force to the rotor 12 by means of jets of gas ejected from turbine nozzles 15 mounted in the stator 11. The rotor 12, thrust rotor 14, and turbine 16 together form a "rotor shaft" rotating at a high speed.

FIG. 7 is a cross-sectional view taken on line b of FIG. 6 showing the conventional high-speed spinner for solid-state NMR measurements. As can be seen from FIG. 7, gas supply holes 20 are formed in the stator 11. A gas is continuously supplied into the stator 11 from the gas supply holes 20 to form a thin layer of gas in the space between the stator 11 and rotor 12. As a result, a journal gas bearing is formed. This creates a state of quite low frictional resistance between the stator 11 and rotor 12. The "rotor shaft" can be spun at a high speed within the stator 11.

FIG. 8 is a cross-sectional view taken on line c of FIG. 6 showing the conventional high-speed spinner for solid-state NMR spectroscopy. As can be seen from FIG. 8, the plural turbine nozzles 15 are mounted eccentrically in the stator 11. Jets of gas ejected from the turbine nozzles 15 act on the blades of the turbine 16, applying a rotating force to the "rotor shaft". The jets of gas change their directions after acting on the turbine 16. The jets are expelled as gas streams 17 shown in FIG. 6 to the outside of the high-speed spinner.

Development of high-speed spinners using such a hydrostatic bearing was commenced by Doty et al. (U.S. Pat. No. 4,456,882). Then, Bartuska et al. have proposed a high-speed spinner comprising a combination of a hydrostatic bearing and a hydrodynamic bearing (U.S. Pat. No. 4,511,841). Doty et al. have attempted improvements of the hydrostatic bearing (U.S. Pat. No. 5,508,615).

The conventional high-speed spinners designed in this way and used for solid-state NMR measurements have some problems which have been great obstacles to increasing the rotational speeds of spinners.

The first problem is that large energy of gas jets is necessary to permit high-speed rotation of the spinner, because the resistance due to the viscosity of the gas on the journal bearing increases with increasing the rotational speed of the spinner but the efficiency of the force of the gas jets acting on the turbine decreases.

The second problem is associated with the hybrid type out of conventional, general NMR spinners (i.e., axial flow type, radial flow type, as well as the hybrid type). In the hybrid type, jets of gas are blown at a turbine from radial directions. The axial kinetic velocity varies when a force is acting on the turbine. This design is simple but the axial stability is low, because an axial force acts on the turbine. Especially, when the flow rate of the jets of gas is increased in an attempt to achieve higher-speed rotation, the thrust rotor and thrust stator will touch each other. This creates a great obstacle in increasing the spinning speed.

To overcome these two problems, Doty et al. (above-cited U.S. Pat. No. 5,508,615) adopted a radial in-flow turbine. However, this radial in-flow turbine has the disadvantage that the rigidity is reduced by the shape of the blades. The turbine of an NMR spinner is frequently damaged because the sample under measurement is often replaced. Hence, this design is disadvantageous in terms of practicality.

Another problem arises from the fact that the number of holes in the nozzles per circumference and the number of blades of the turbine have a common divisor. That is, the torque varies periodically in magnitude during one revolution of the turbine, making the rotation unstable.

SUMMARY OF THE INVENTION

In view of the foregoing, it is an object of the present invention to provide a high-speed spinner which is adapted for solid-state NMR measurements and which has a hybrid type turbine but provides a high efficiency of rotation when a gas is blown at the turbine, assures stable high-speed rotations, and permits the rotational speed to be monitored precisely.

A high-speed spinner adapted for solid-state NMR measurements and fabricated in accordance with the present invention comprises: a rotor portion capable of being sealed with a sample; and a stator portion surrounding the rotor portion. A gas is supplied into the space between the rotor and stator portions via gas supply holes to thereby form a gas bearing. The rotor portion is fitted with a turbine at which the gas is blown. This spinner is characterized in that the turbine vents the blown gas at a given angle to radial directions. In consequence, a rotating force is applied to the rotor portion itself.

The invention also provides a high-speed spinner for solid-state NMR measurements, the spinner comprising: a rotor portion capable of being sealed with a sample; and a stator portion surrounding the rotor portion. A gas is supplied into the space between the rotor and stator portions via gas supply holes to thereby form a gas bearing. The rotor portion is fitted with a turbine having blades. The gas is blown at the turbine. This spinner is characterized in that the number of the blades is greater than, and prime to, the number of the gas supply holes.

Furthermore, the invention provides a high-speed spinner for solid-state NMR measurements, the spinner comprising: a rotor portion capable of being sealed with a sample; and a stator portion surrounding the rotor portion. A gas is supplied into the space between the rotor and stator portions via gas supply holes to thereby form a gas bearing. The rotor portion is fitted with a turbine having blades, and the gas is blown at the turbine. This spinner is characterized in that the turbine vents the blown gas rearward at a given angle to radial directions. In consequence, a rotating force is applied to the rotor portion itself. The spinner is also characterized in that the number of the blades is greater than, and prime to, the number of the gas supply holes.

In another feature of the invention, the rotor has an auxiliary thrust stator extending in the thrust direction to carry the rotor portion while rotating it.

In a further feature of the invention, the given angle that the gas blown at the turbine forms with respect to radial directions when vented rearward is in the range of from 30° to 60°.

In a still other feature of the invention, the diameter of the rotor portion is in the range of from 2 mm to 4 mm.

In a yet other feature of the invention, the length of the gas bearing is in the range of from 50% to 100% of the diameter of the rotor portion.

In an additional feature of the invention, the space between the rotor and stator portions is in the range of from 0.68% to 2.1% of the diameter of the rotor portion.

In a yet further feature of the invention, the space between the rotor and stator portions is in the range of from 27 $\mu$m to 42 $\mu$m.

In a still additional feature of the invention, the number of the gas supply holes for supplying the gas into the space between the rotor and stator portions is in the range of from 6 to 10.

In a still further feature of the invention, the diameter of each gas supply hole for supplying the gas into the space between the rotor and stator portions is in the range of from 0.2 mm to 0.4 mm.

In an additional feature of the invention, a thin metal film is formed on a part of the rotor portion to reflect light.

In an additional feature of the invention, the thin metal film is made of gold.

In an additional feature of the invention, the thickness of the thin metal film is in the range of from 10 nm to 1000 nm.

Other objects and features of the invention will appear in the course of the description thereof, which follows.

DESCRIPTION OF THE PREFERRED EMBODIMENTS

Figure 1:
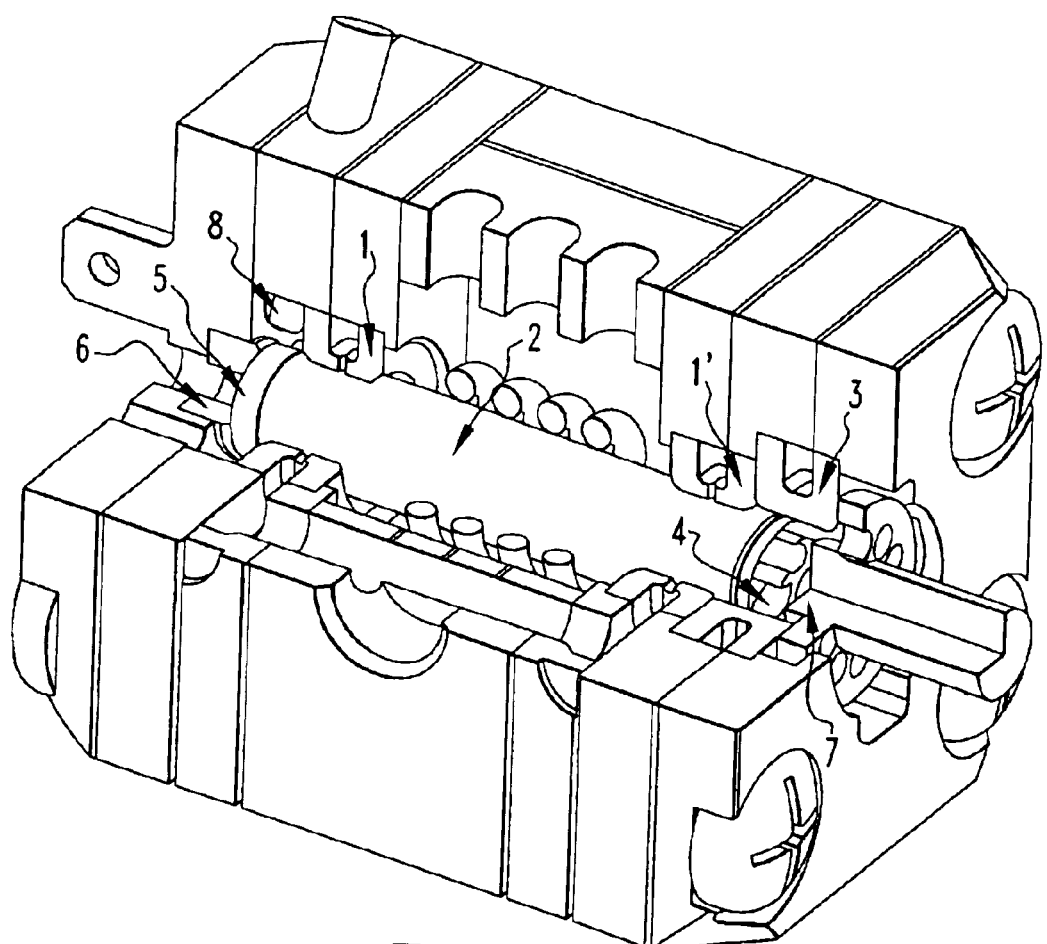
FIG. 1 is a perspective view of a high-speed spinner according to the present invention, the spinner being used for solid-state NMR measurements.

Referring to FIG. 1, there is shown a high-speed spinner according to the present invention, the spinner being used for solid-state NMR measurements. The invention improves the efficiency of rotation of the rotor using blowing of jets of gas without complicating the shape of the rotor. Also, the stability is enhanced. Thus, the aforementioned problems are solved. The rotational speed of the spinner in the detection portion of an NMR spectrometer is increased.

Referring particularly to FIG. 1, the NMR spinner has a cylindrical rotor 2 capable of holding a sample to be investigated by NMR spectroscopy. A turbine 4 having blades for receiving jets of gas and a cover integral with the blades is mounted to one end (right end in the figure) of the rotor 2. The cover permits the sample to be placed into the rotor. A cap 5 is mounted at the other end (left end in the figure) to permit the investigated sample to be sealed into the rotor. These three components together form a "rotor shaft" rotating as a unit during rotation of the spinner. Preferably, the diameter of the rotor 2 is about 2 to 4 mm.

A thrust stator 6 holding the whole rotor 2 is mounted opposite to the cap 5. An auxiliary thrust stator 7 is mounted opposite to the turbine 4 to stabilize the rotation of the rotor 2 and to prevent contact between the rotor 2 and thrust stator 6. Specifically, gas lingering in the space between the turbine 4 and auxiliary thrust stator 7 is drawn out together with the stream of high-pressure gas flowing around the turbine 4. The hydrostatic pressure of the gas in the space between the turbine 4 and auxiliary thrust stator 7 is reduced according to the Bernoulli law. Consequently, contact between the rotor 2 and thrust stator 6 is prevented. Two cylindrical stator halves 1 and 1' forming a stator portion (gas bearing portion) are mounted around the rotor 2. This stator portion maybe hereinafter simply referred to as the stator 1.

Two pieces of optical fiber 8 for detecting the rotational speed of the rotor 2 are mounted in positions opposite to the cap 5. This will be described in detail by referring to FIG. 4.

FIG. 2(a) is a cross-sectional view of the bearing portion of the high-speed NMR spinner shown in FIG. 1, taken along a plane including the axis of rotation of the rotor. FIG. 2(b) is a cross-sectional view of this bearing portion, taken along a plane perpendicular to the axis of rotation of the rotor.

In FIG. 2(a), the value (Cr) of the space between the stator 1 and rotor 2 is preferably about 27 to 42 $\mu$m. Preferably, the ratio of the space to the diameter ($\phi$D) of the rotor 2 is approximately 0.68 to 2.1%. Furthermore, the length (L) of the bearing portion is about 50 to 100% of the diameter of the rotor 2. In this structure, the value (Cr) of the space between the stator 1 and the rotor 2 is considerably larger than that in a conventional, general hydrostatic bearing. The length (L) of the bearing portion is smaller than that of a conventional, general hydrostatic bearing. Consequently, the restoring force due to the viscosity of the high-pressure gas hardly acts on the rotor 2. As a result, whirl (i.e., precessing motion of the axis of rotation of the rotor 2) intrinsic to a high-speed spinner using a journal bearing can be prevented effectively.

Figure 2:
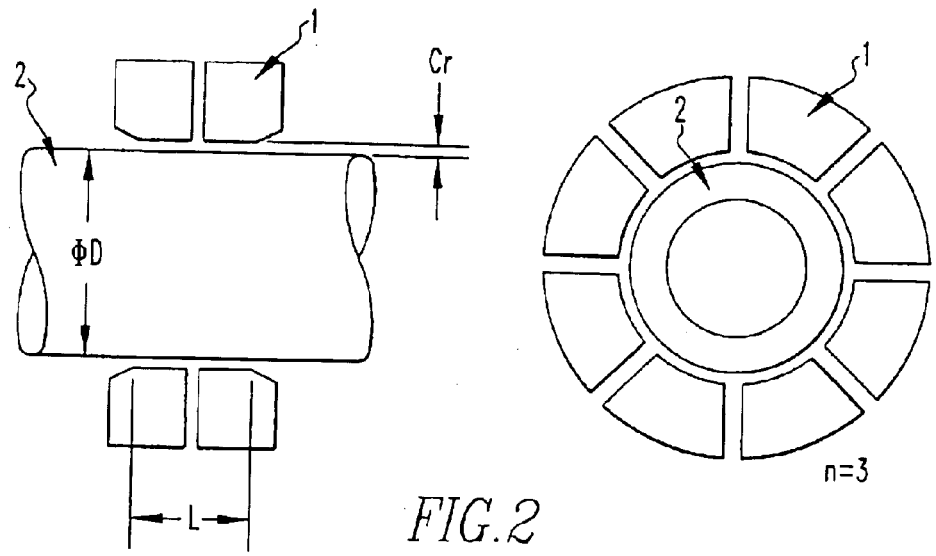
FIG. 2 is a schematic view showing one example of the bearing portion of the high-speed NMR spinner shown in FIG. 1.

Each of the stator halves 1 and 1' is provided with one or more arrays of gas supply holes arranged circumferentially. Each of the supply holes preferably has a diameter of about 0.2 to 0.4 mm. Each array consists of about 6 to 10 gas supply holes. A high-pressure gas is supplied into the space (Cr) with the rotor 2 from the supply holes. A gas bearing is formed between the rotor 2 and each of the stator halves 1, 1'. Thus, the rotor 2 is held. In the embodiment of FIG. 2(*b*), each array of gas supply holes arranged circumferentially consists of eight gas supply holes.

Figure 3:
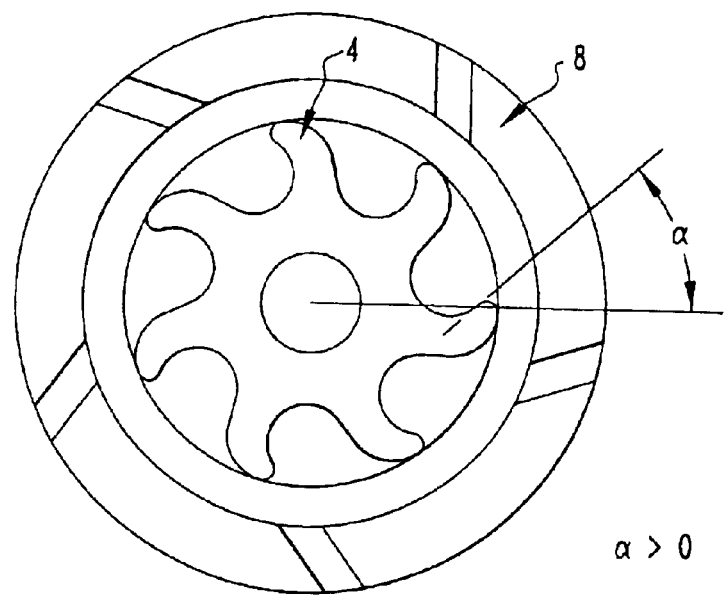
FIG. 3 is a cross section of one example of the turbine portion of the high-speed NMR spinner shown in FIG. 1.

FIG. 3 is a cross-sectional view of the vicinities of the turbine of the high-speed NMR spinner shown in FIG. 1, taken along a plane perpendicular to the axis of rotation of the rotor.

A turbine nozzle 3 having plural gas supply holes tilted at an angle to radial directions of the turbine is mounted around the turbine 4. Jets of high-pressure gas blown at the turbine 4 from the supply holes in the turbine nozzle 3 apply a rotating torque to the turbine 4. Since the blades of the turbine 4 are oriented in a direction opposite to the direction of rotation and tilted at a given angle of a to the radial directions, the jets of the gas blown at the blades of the turbine 4 flow along the directions of tilt of the blades. The jets flow rearwardly as viewed from the direction of rotation of the turbine 4 while making the given angle α to the radial directions and are then vented from the blades. Thereafter, the jets of gas are vented into the atmosphere through the holes formed in the auxiliary thrust stator 7. Preferably, the given angle a is about 30 to 60°. In the embodiment of FIG. 3, the angle is set to about 42°.

The directions in which the jets of gas are vented from the blades of the turbine 4 are directed outward and rearward from the radial directions of rotation of the turbine 4 in this way. Consequently, the efficiency of the action of the jets of gas on the turbine 4 can be enhanced.

In the present invention, the number of the blades of the turbine 4 is set greater than, and prime to, the number of the holes formed in the turbine nozzle 3 to prevent the magnitude of the torque from varying periodically during one revolution of the turbine 4; otherwise, whirl would occur and the rotation would become unstable.

For example, in the embodiment of FIG. 3, the number of the holes formed in the turbine nozzle 3 is five. The number of the blades of the turbine 4 is seven. The number "5" of the blades of the turbine 4 and the number "7" of the holes formed in the turbine nozzle 3 have no common divisor other than "1". Therefore, "5" and "7" are prime to each other. Consequently, the magnitude of the torque applied on the blades of the turbine 4 will not vary periodically. Also, no whirl will take place. In this way, the rotation can be prevented from becoming unstable.

Figure 4:
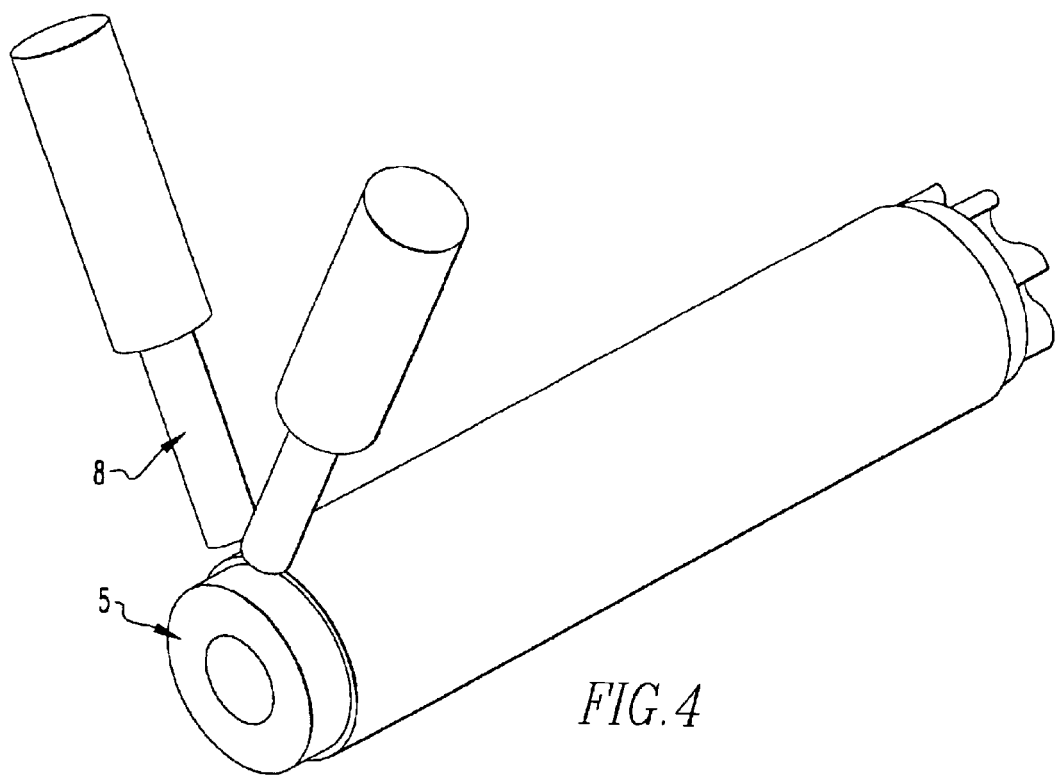
FIG. 4 is a perspective view of one example of the rotational-speed detection portion of the high-speed NMR spinner shown in FIG. 1.

FIG. 4 shows the relation of the cap 5 of the high-speed spinner shown in FIG. 1 to the aforementioned two pieces of optical fiber 8, the spinner being used for solid-state NMR measurements. A thin metal film (not shown) is formed on a part of the outer surface of the cap 5. The two pieces of optical fiber 8 are placed opposite to the cap 5 and form a given angle therebetween. Light is shot at the cap from one of the pieces of fiber 8. When the cap 5 rotates with the rotor 2 and the thin metal film on the cap passes ahead of the emitting piece of fiber 8, the light is reflected by the thin metal film and received by the other piece of fiber 8. In this way, the period of the reflected light is detected and monitored. As a result, the rotational speed of the rotor 2 rotating at a high speed can be measured accurately.

In the above embodiment, the thin metal film is formed on the outer surface of the cap 5. It is to be noted that the present invention is not limited to this structure. For instance, the film may be formed on a part of the rotor 2 itself. The cap 5 may be regarded as a part of the rotor in a broad meaning.

If the thin metal film is extremely thin for the wavelength of the light, the film cannot reflect the emitted light. Conversely, if the film is too thick, strong centrifugal force created by the high-speed rotation of the rotor 2 will peel off the film. Accordingly, limitations are imposed on the thickness of the thin metal film. Preferably, the thickness is between 10 and 1000 nm, more preferably between 30 and 100 nm. In the present embodiment, the thin metal film is made of gold. This gold film is chemically stable and the ability to reflect light will not deteriorate over a long period of time.

Figure 5:
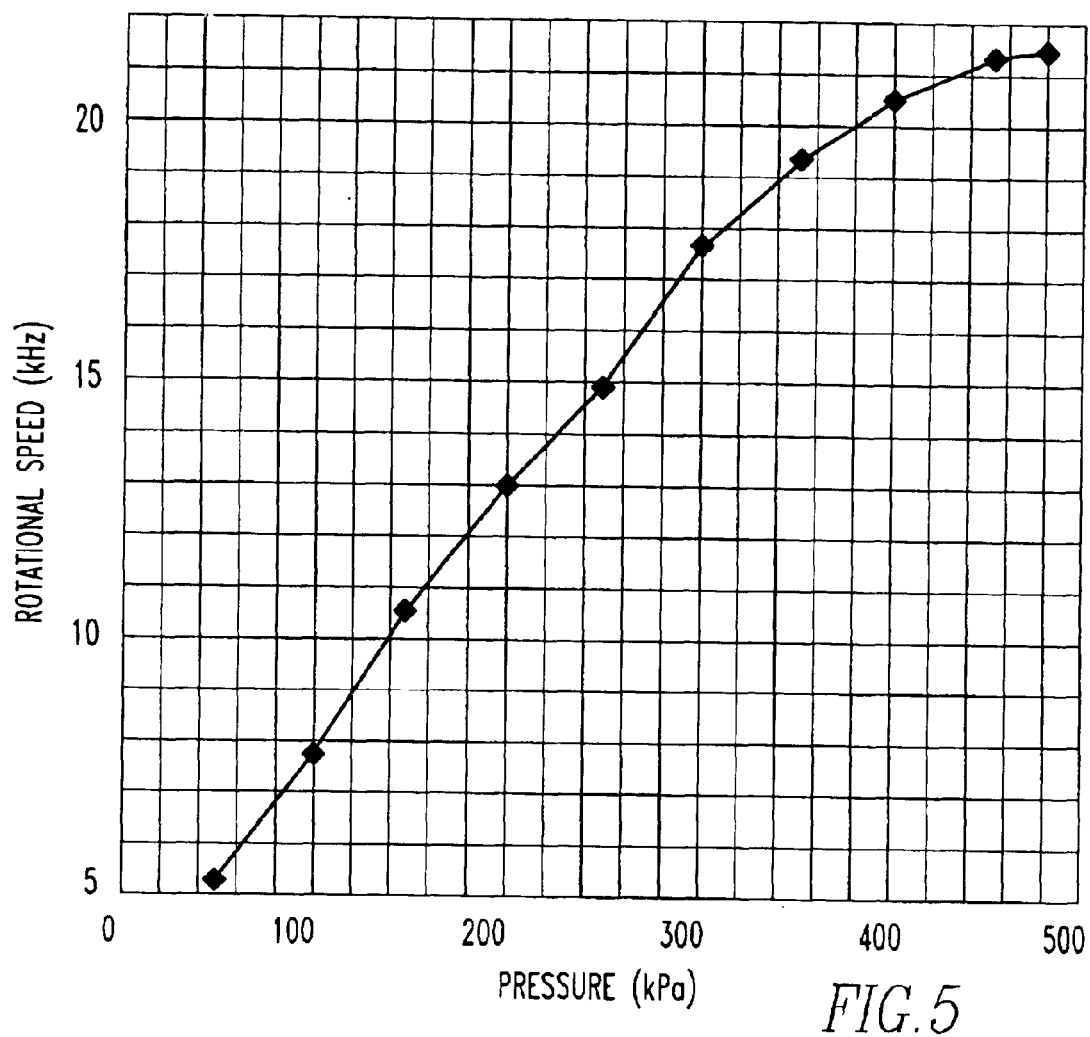
FIG. 5 is a graph showing the results of an experiment performed on a high-speed spinner according to the present invention, the spinner being used for solid-state NMR measurements.
Figure 6:
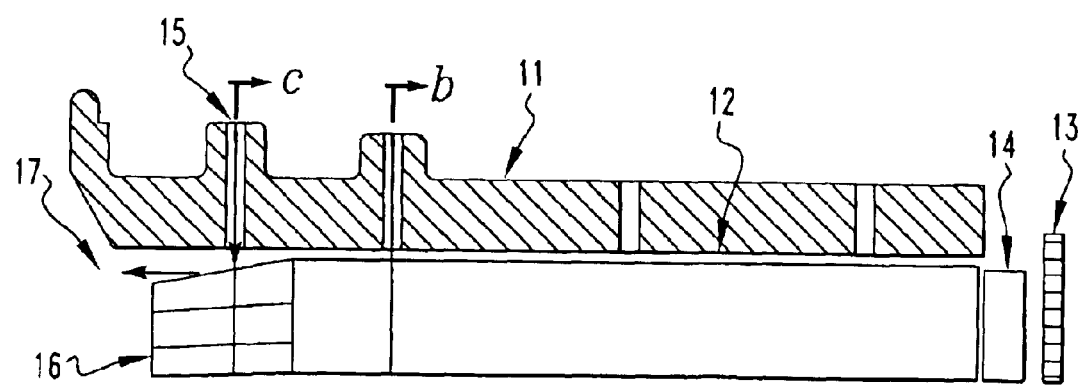
FIG. 6 is a cross section of a conventional high-speed spinner for solid-state NMR measurements.
Figure 7:
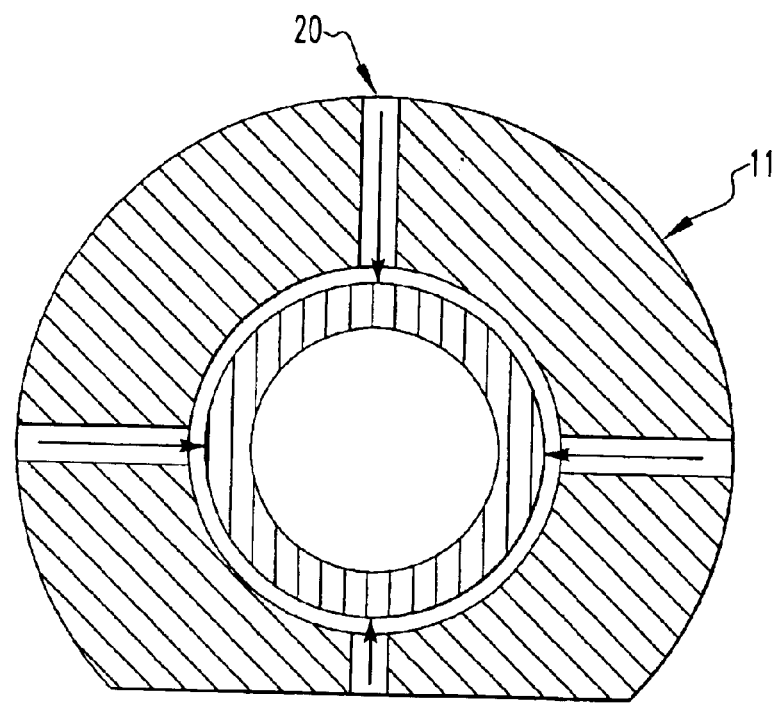
FIG. 7 is a cross section of another conventional high-speed spinner for solid-state NMR measurements.
Figure 8:
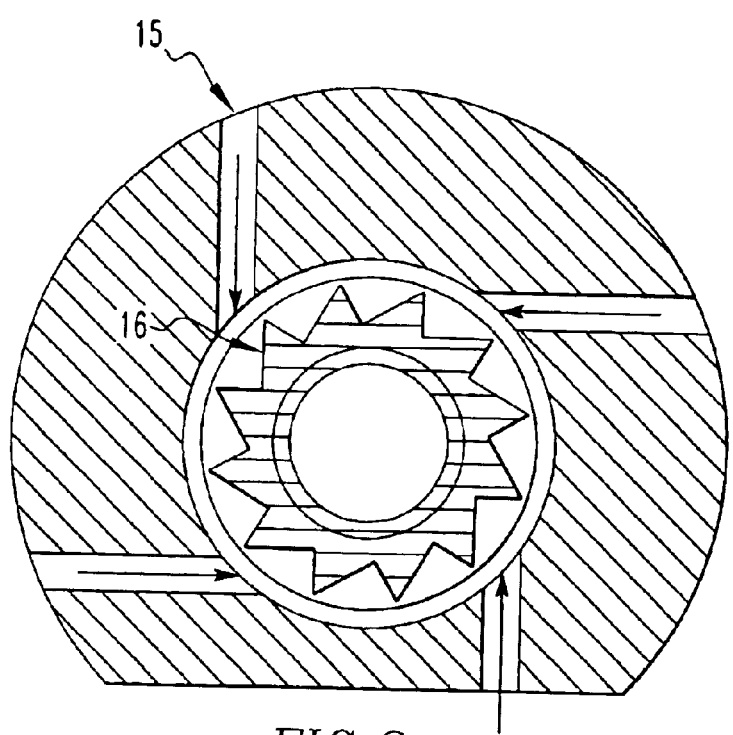
FIG. 8 is a cross section of a further conventional high-speed spinner for solid-state NMR measurements.

FIG. 5 shows the results of an experiment performed on a high-speed spinner fabricated according to the design concept of the present invention. The horizontal axis of the graph indicates the pressure (in kPa) applied by high-pressure gas supplied to the turbine nozzle 3. The vertical axis indicates the rotational speed (in kHz) of the rotor 2.

To carry out this experiment resulting in these data, the dimensions and parameters of the adopted high-speed spinner are as follows.

(1) Diameter (ϕD) of the rotor: 4 mm
(2) Length (L) of the bearing portion: 2.4 mm (60% of ϕD)
(3) Space (Cr) in the bearing: 30 μm (0.75% of ϕD)
(4) Number (n) of the gas supply holes: 8 per array
(5) Diameter of each gas supply hole: 0.3 mm
(6) Angle (α) of the blades of the turbine: 42°
(7) Number of the blades: 7
(8) Number of the holes in the turbine nozzle: 5

As can be seen from FIG. 5, when the pressure applied by the high-pressure gas supplied to the turbine nozzle 3 is increased to 400 kPa, the rotational speed of the rotor 2 increases to 20 kHz (corresponding to 20,000 rotations per second) roughly in proportion to the applied pressure. When the pressure exceeds 400 kPa, the increasing rate of the rotational speed of the rotor 2 shows a tendency of saturation but can be increased to the neighborhood of 21.5 kHz. This result far exceeds the heretofore known record of rotational speed of high-speed spinners for solid-state NMR measurements.

As described thus far, the inventive high-speed spinner for solid-state NMR measurements is fitted with the turbine against which gas is blown. The gas is vented rearward at a given angle to radial directions, thus applying a rotating force to the rotor itself. As a result, the efficiency of action of the jets of gas on the turbine is improved.

Furthermore, the turbine having the blades is mounted in the rotor portion, it being noted that the number of the blades is greater than, and prime to, the number of the holes in the nozzle for blowing out gas. Consequently, the magnitude of the torque applied to the blades of the turbine 4 is prevented from varying periodically. Also, the rotation is prevented from becoming unstable.

What is claimed is:

1. A high-speed spinner for solid-state NMR measurements, said high-speed spinner comprising:
   a rotor portion capable of being sealed with a sample;
   a stator portion surrounding said rotor portion;
   a space formed between said rotor portion and said stator portion, said space being supplied with a gas via gas supply holes to thereby form a gas bearing;
   a turbine mounted in said rotor portion and having blades that are greater in number than the gas supply holes, the number of the blades being prime to the number of the gas supply holes; and
   said turbine mounted in said rotor portion and at which the gas is blown, said turbine venting the blown gas rearward at as viewed from the direction of rotation at a given angle to radial directions, whereby a rotating force is applied to said rotor portion itself.

2. The high-speed spinner of claim 1, wherein said rotor portion is fitted with an auxiliary thrust stator extending in a thrust direction to carry said rotor portion while rotating it.

3. The high-speed spinner of claim 1, wherein said given angle that the gas blown at the turbine forms with the radial directions when vented rearward is in the range of from 30° to 60°.

4. The high-speed spinner of claim 1, wherein said rotor portion has a diameter in the range of from 2 mm to 4 mm.

5. The high-speed spinner of claim 1, wherein said gas bearing has a length in the range of from 50% to 100% of the diameter of said rotor portion.

6. The high-speed spinner of claim 1, wherein said space between said rotor portion and said stator portion is in the range of from 0.68% and 2.1% of the diameter of said rotor portion.

7. The high-speed spinner of claim 1, wherein said space between said rotor portion and said stator portion is in the range of from 27 $\mu$m to 42 $\mu$m.

8. The high-speed spinner of claim 1, wherein the number of said gas supply holes for supplying the gas into the space between said rotor portion and said stator portion is in the range of from 6 to 10.

9. The high-speed spinner of claim 1, wherein each of said gas supply holes for supplying the gas into the space between said rotor portion and said stator portion has a diameter in the range of from 0.2 mm to 0.4 mm.

10. The high-speed spinner of claim 1, wherein a thin metal film is formed on a part of said rotor portion to reflect light.

11. The high-speed spinner of claim 10, wherein said thin metal film is made of gold.

12. The high-speed spinner of claim 10, wherein said thin metal film has a thickness in the range of from 10 nm to 1000 nm.

* * * * *

UNITED STATES PATENT AND TRADEMARK OFFICE
CERTIFICATE OF CORRECTION

PATENT NO. : 6,803,764 B2
DATED : October 12, 2004
INVENTOR(S) : Hioka

It is certified that error appears in the above-identified patent and that said Letters Patent is hereby corrected as shown below:

Column 1,
Line 16, "rearward at as viewed" should read -- rearward as viewed --

Signed and Sealed this

Twenty-sixth Day of April, 2005

JON W. DUDAS
*Director of the United States Patent and Trademark Office*